United States Patent
Sporck et al.

(10) Patent No.: US 7,116,119 B2
(45) Date of Patent: Oct. 3, 2006

(54) PROBE CARD WITH COPLANAR DAUGHTER CARD

(75) Inventors: Alistair Nicholas Sporck, Saratoga, CA (US); Makarand S. Shinde, Livermore, CA (US)

(73) Assignee: FormFactor, Inc., Livermore, CA (US)

(*) Notice: Subject to any disclaimer, the term of this patent is extended or adjusted under 35 U.S.C. 154(b) by 0 days.

(21) Appl. No.: 11/059,164

(22) Filed: Feb. 15, 2005

(65) Prior Publication Data

US 2005/0140381 A1   Jun. 30, 2005

Related U.S. Application Data

(63) Continuation of application No. 09/832,913, filed on Apr. 10, 2001, now Pat. No. 6,856,150.

(51) Int. Cl.
*G01R 31/02* (2006.01)
(52) U.S. Cl. .................................................... 324/754
(58) Field of Classification Search ........ 324/754–765, 324/158.1
See application file for complete search history.

(56) References Cited

U.S. PATENT DOCUMENTS

| | | | |
|---|---|---|---|
| 3,849,728 A | 11/1974 | Evans | |
| 4,480,223 A | 10/1984 | Aigo | |
| 4,567,432 A | 1/1986 | Buol et al. | |
| 4,636,722 A | 1/1987 | Ardezzone | |
| 4,780,670 A | 10/1988 | Cherry | |
| 4,795,977 A | 1/1989 | Frost et al. | |
| 4,837,622 A | 6/1989 | Whann et al. | |
| 4,965,865 A | 10/1990 | Trenary | |
| 4,983,907 A | 1/1991 | Crowley | |
| 5,055,778 A | 10/1991 | Okubo et al. | |
| 5,070,297 A * | 12/1991 | Kwon et al. ................. | 324/754 |
| 5,090,118 A | 2/1992 | Kwon et al. | |
| 5,124,646 A | 6/1992 | Shiraishi | |
| 5,148,103 A | 9/1992 | Pasiecznik, Jr. | |
| 5,323,107 A * | 6/1994 | D'Souza ..................... | 324/754 |
| 5,329,226 A | 7/1994 | Monnet et al. | |
| 5,399,982 A | 3/1995 | Driller et al. | |
| 5,461,327 A * | 10/1995 | Shibata et al. ............. | 324/760 |
| 5,497,079 A | 3/1996 | Yamada et al. | |
| 5,521,518 A | 5/1996 | Higgins | |
| 5,534,784 A | 7/1996 | Lum et al. | |
| 5,550,480 A | 8/1996 | Nelson et al. | |
| 5,629,631 A | 5/1997 | Perry et al. | |
| 5,642,054 A | 6/1997 | Pasiecznik, Jr. | |

(Continued)

FOREIGN PATENT DOCUMENTS

JP         06-050990         2/1994

(Continued)

OTHER PUBLICATIONS

U.S. Appl. No. 10/828,755, filed Apr. 21, 2004, Miller et al.

*Primary Examiner*—Jermele Hollington
(74) *Attorney, Agent, or Firm*—N. Kenneth Burraston

(57) ABSTRACT

A probe card assembly includes a printed circuit board with tester contacts for making electrical connections to a semiconductor tester. The probe card assembly also includes a probe head assembly with probes for contacting a semiconductor device under test. One or more daughter cards is mounted to the printed circuit board such that they are substantially coplanar with the printed circuit board. The daughter cards may contain a circuit for processing test data, including test signals to be input into the semiconductor and/or response signals generated by the semiconductor device in response to the test signals.

26 Claims, 11 Drawing Sheets

U.S. PATENT DOCUMENTS

| | | | |
|---|---|---|---|
| 5,642,056 A * | 6/1997 | Nakajima et al. | 324/758 |
| 5,670,889 A | 9/1997 | Okubo et al. | |
| 5,729,150 A | 3/1998 | Schwindt | |
| 5,806,181 A | 9/1998 | Khandros et al. | |
| 5,821,763 A | 10/1998 | Beaman et al. | |
| 5,828,226 A | 10/1998 | Higgins et al. | |
| 5,834,946 A | 11/1998 | Albrow et al. | |
| 5,974,662 A | 11/1999 | Eldridge et al. | |
| 6,064,213 A | 5/2000 | Khandros et al. | |
| 6,133,744 A | 10/2000 | Yojima et al. | |
| 6,137,296 A | 10/2000 | Yoon et al. | |
| 6,160,412 A | 12/2000 | Martel et al. | |
| 6,166,552 A | 12/2000 | O'Connell | |
| 6,175,241 B1 | 1/2001 | Hembree et al. | |
| 6,232,669 B1 * | 5/2001 | Khoury et al. | 257/784 |
| 6,250,933 B1 * | 6/2001 | Khoury et al. | 324/754 |
| 6,351,134 B1 | 2/2002 | Leas et al. | |
| 6,380,753 B1 | 4/2002 | Iino et al. | |
| 6,400,173 B1 | 6/2002 | Shimizu et al. | |
| 6,476,626 B1 * | 11/2002 | Aldaz et al. | 324/757 |
| 6,603,323 B1 | 8/2003 | Miller | |
| 6,621,710 B1 * | 9/2003 | Cheng et al. | 324/754 |
| 6,677,771 B1 * | 1/2004 | Zhou et al. | 324/758 |
| 6,798,225 B1 | 9/2004 | Miller | |
| 6,799,976 B1 * | 10/2004 | Mok et al. | 439/55 |
| 6,815,961 B1 * | 11/2004 | Mok et al. | 324/754 |
| 6,856,150 B1 * | 2/2005 | Sporck et al. | 324/754 |
| 2001/0054905 A1 | 12/2001 | Khandros et al. | |
| 2005/0088167 A1 | 4/2005 | Miller | |

FOREIGN PATENT DOCUMENTS

WO    WO01/09623 A1 * 2/2001

* cited by examiner

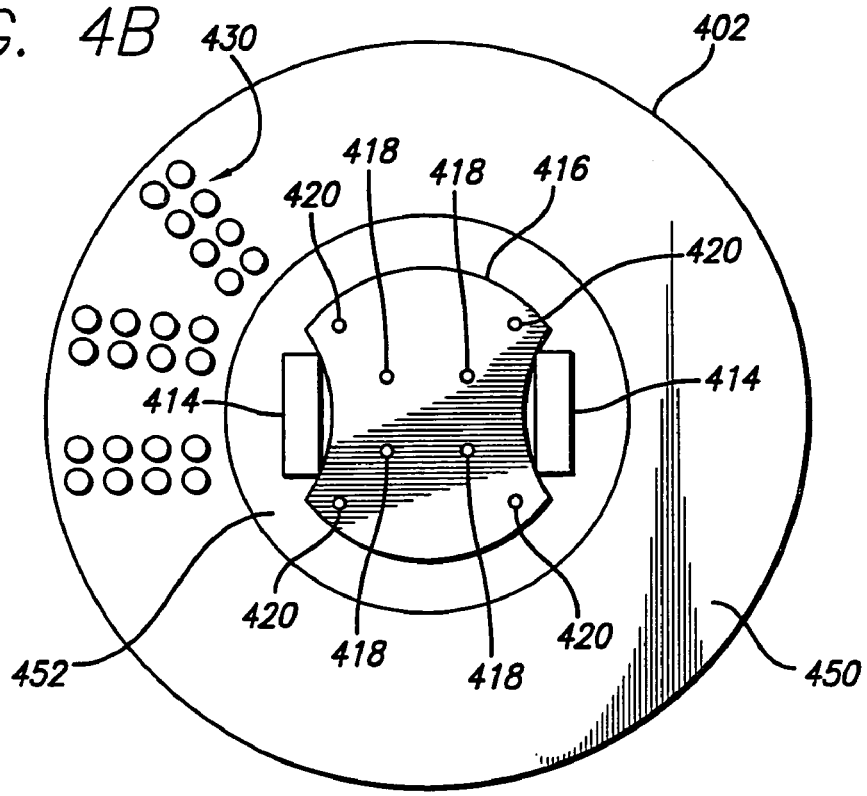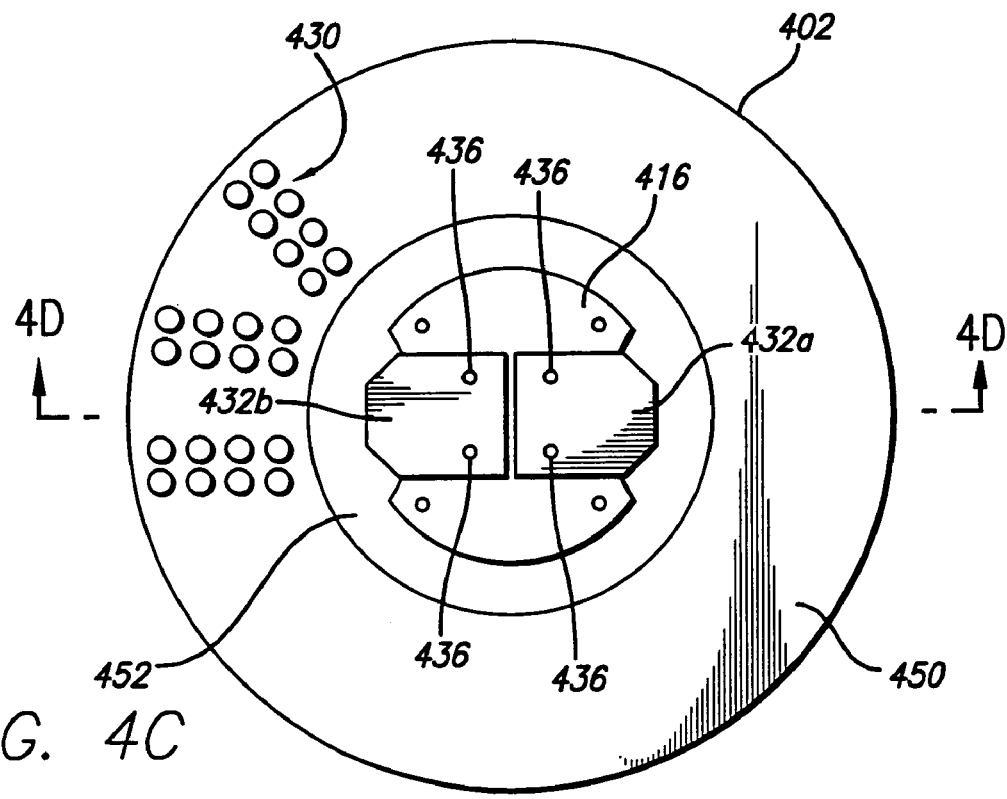

FIG. 6D
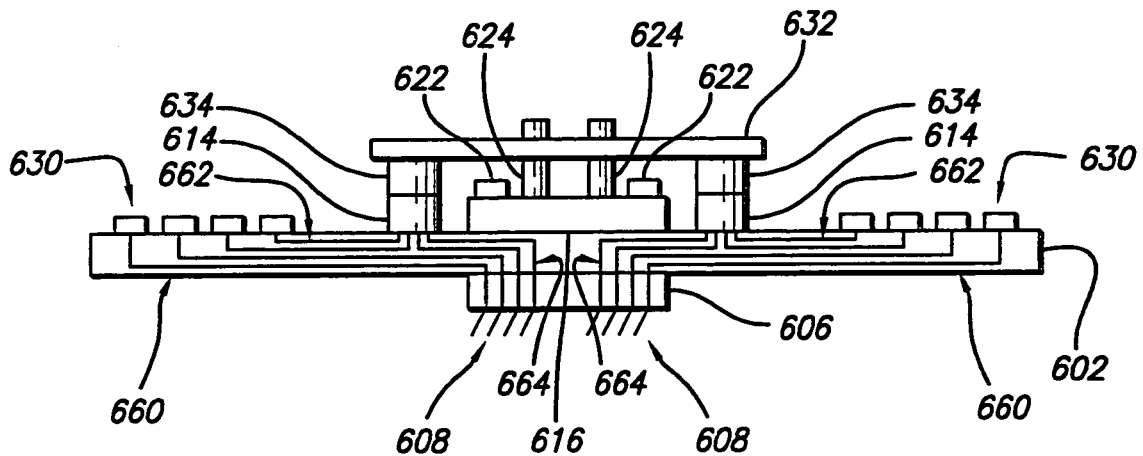
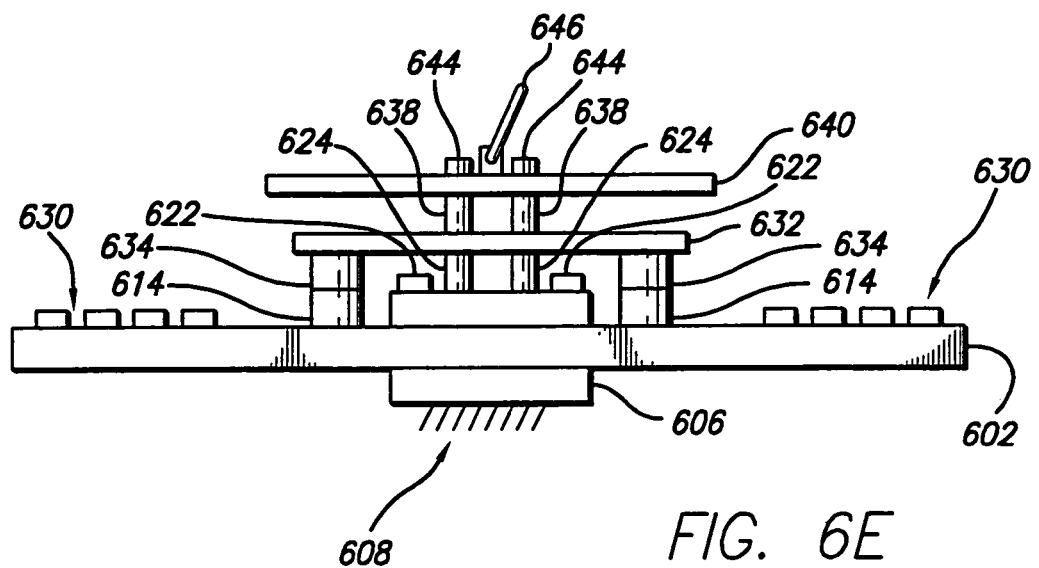
FIG. 6E

PROBE CARD WITH COPLANAR DAUGHTER CARD

CROSS-REFERENCE TO RELATED APPLICATIONS

This application is a continuation of U.S. patent application Ser. No. 09/832,913, filed Apr. 10, 2001 (now U.S. Pat. No. 6,856,150).

BACKGROUND OF THE INVENTION

1. Field of the Invention

This invention relates generally to probe card assemblies used in the testing of integrated circuits and more specifically to a probe card assembly with a coplanar daughter card.

2. Background

A probe card assembly is used to test semiconductor devices during manufacture to determine whether the semiconductor devices function properly. As is known, a semiconductor tester generates test signals to be input into the semiconductor device. The semiconductor tester then monitors and analyzes signals generated by the semiconductor device in response to the test signals to determine whether the semiconductor device is functioning correctly. Generally speaking, a probe card assembly acts as an interface between the semiconductor tester and the semiconductor device, routing the test signals from the semiconductor tester to specific input points on the semiconductor device, and also routing signals generated by the semiconductor device in response to the test signals back to the semiconductor tester.

FIGS. 1A–1C illustrate a typical prior art test arrangement. As shown, a typical probe card assembly 100 includes a printed circuit board 102, which is usually round and contains a pattern of tester contacts 130 for connecting to a semiconductor tester 120. It should be noted that the contacts 130 are typically formed all around the printed circuit board 102; in FIG. 1B only a few of such contacts 130 are shown. The semiconductor tester may include pogo-style pins 122 that contact the tester contacts 130. Rather than pogo-style pins, however, the semiconductor tester 120 may use any mechanism for establishing a temporary electrical connection with the tester contacts 130. A probe head assembly 106 is attached to printed circuit board 102. The probe head assembly 106 includes probes 108 for contacting the semiconductor devices being tested (not shown). The probe head assembly 106 is typically attached to the printed circuit board 102 via mechanism 104.

As shown in FIG. 1C (which illustrates a cross-section of the probe card assembly 100 shown in FIG. 1B) electrical traces 150 on or within the printed circuit board 102 connect the tester contacts 130 to the probe head assembly 106 and ultimately to probes 108. Thus, electrical paths between inputs and outputs (not shown) on the semiconductor tester 120, on one hand, and the probes 108, on the other hand, are established. As also shown in FIG. 1C, a typical probe head assembly 106 consists of a space transformer 156 that is connected to the printed circuit board 102 via connections 152. The connections 152 may be, for example, solder ball connections or contact pins soldered to the printed circuit board 102, the space transformer 156, or both. Traces 150 on or within the printed circuit board 102 connect the tester contacts 130 to the connections 152, and traces 154 on or within the space transformer 156 connect the connections 152 to the probes 108.

FIG. 2 illustrates another type of probe head assembly 106, an example of which is described in detail in U.S. Pat. No. 5,974,662, assigned to the current assignee of the instant application and incorporated herein by reference in its entirety. The printed circuit board 202 of FIG. 2 may be similar or even identical to the printed circuit board 102 of FIGS. 1A–1C. The printed circuit board 202 includes tester contacts 230 for connecting to a semiconductor tester (not shown). The tester contacts 230 are connected to probe head contacts 210 in a manner similar to which the tester contacts 130 are connected to connections 152 in FIG. 1C. (These connections are not shown in FIG. 2 because FIG. 2 is not a cross-sectional view.)

In FIG. 2, the probe head assembly 106 includes an interposer 216 and a space transformer 224. Resilient interconnection elements 212 provide electrical connections between contacts 210 on the printed circuit board 202 and contacts 214 one side of the interposer 216. Similarly, resilient interconnection elements 220 provide electrical connections between contacts 218 on the other side of the interposer 216 and contacts 222 on the space transformer. Internal connections (not shown) within the interposer 216 connect contacts 214 on one side of the interposer to contacts 218 on the other side of the interposer. Similarly, internal connections (not shown) within space transformer 224 connect contacts 222 to probes 226. Probes 226, which directly contact test points on the semiconductor being tested, may be resilient contacts, such as those described in U.S. Pat. No. 5,476,211, U.S. Pat. No. 5,917,707, and U.S. Pat. No. 6,184,053 B1, all assigned to the currently assignee of the instant application, and all incorporated herein by reference in their entirety. Likewise, resilient interconnection elements 212 and 220 may be resilient contacts.

It should be noted that no particular type of probe head assembly 106 is critical to the instant invention. Indeed, the instant invention may be used in connection with either the type of probe head assembly 106 described in FIGS. 1A–1C or FIG. 2 or any other type of probe head assembly suitable for probing semiconductor devices.

Generally speaking, the pattern of test signals generated by the semiconductor tester 120 must be unique to the semiconductor device being tested. Semiconductor testers, however, are typically designed to output a limited number of test patterns. This means that the test signals output by the semiconductor tester 120 often must be processed by circuitry located on the printed circuit board 102 or 202 so that the test signals delivered to the semiconductor device at the probes 108 or 226 are as required by the semiconductor device. That is, the test signals generated by the semiconductor tester 120 must be enhanced or customized to suit the particular test needs of the semiconductor device. Similarly, signals output by the semiconductor device in response to the test signals may need to be processed by circuitry located on the printed circuit board 102 or 202 before being passed back to the semiconductor tester 120. Again, the signals generated by the semiconductor device must be customized to the particular test requirements of the semiconductor device.

Such circuitry cannot be located on the printed circuit board 102 in such a way as to interfere with the connections between the tester contacts 130 on the printed circuit board and the semiconductor tester's 120 pogo pins 122. As shown in FIG. 3A, the tester contacts 130 are typically located in an outer area 140 of the printed circuit board 102. This means that the processing circuitry 302 is typically located entirely within an inner area 142 of the printed circuit board 102. Indeed, the greater the number of connections between the semiconductor tester 120 and the probe card assembly 100, the less space there is within the outer area 140 of the printed circuit board 102 for things such as processing circuitry (not shown). In recent years, the number and density of probes 108 on the probe head assembly 106 has steadily increased, which has caused a corresponding increase in the amount of test data sent to and received from the probes 106. Of course, an increasing amount of data flowing between the semiconductor tester 120 and the probes 106 requires an increasing number of connections between the semiconductor tester 120 and the printed circuit board 102.

As shown in FIG. 3B, some traces 150a may connect tester contacts 130 directly to the probe card assembly 106. Other traces 150b, however, may connect tester contacts 130 to processing circuitry 302, which in turn is connected to probe head assembly 106 by traces 150c. It should be understood that the probe head assembly 106 shown in FIGS. 3A and 3B can be any probe head assembly suitable for contacting a semiconductor device under test, including but not limited to the probe head assemblies 106 illustrated in FIGS. 1A–1C and FIG. 2.

In recent years, the size of probe head assemblies has steadily grown. As should be apparent, the larger the probe head assembly, the less room there is on the printed circuit board for processing circuitry. Therefore, there is a need for a method and apparatus for locating processing circuitry on a probe card assembly in such a way as to allow for the use of larger probe head assemblies while not interfering with connections between the semiconductor tester and the probe card assembly.

BRIEF SUMMARY OF THE INVENTION

The invention relates generally to probe card assemblies. The probe card assembly includes a printed circuit board with contacts for connecting to a semiconductor tester and a probe head assembly with probes for connecting to a semiconductor device under test. The probe card assembly also includes one or more daughter cards secured to and substantially coplanar with the printed circuit board. The daughter cards may contain elements composing a processing circuit for processing test data. The test data may include test signals to be input into the semiconductor or response signals generated by the semiconductor device in response to the test signals or both.

BRIEF DESCRIPTION OF THE DRAWINGS

FIG. 4B illustrates a top view of the embodiment of FIG. 4A without its cover and daughter card.

FIG. 4C illustrates a top view of the embodiment of FIG. 4A without its cover.

FIG. 6D illustrates a sectional view of FIG. 6C.

FIG. 6E illustrates a side view of the embodiment of FIG. 6A.

DETAILED DESCRIPTION OF EMBODIMENTS OF THE INVENTION

The present invention is directed to a probe assembly having a substantially coplanar daughter card or cards. The following describes one or more exemplary embodiments of the invention. The invention, however, is not limited to the following exemplary embodiments or to the manner in which the exemplary embodiments operate or are described herein.

Figure 1A:
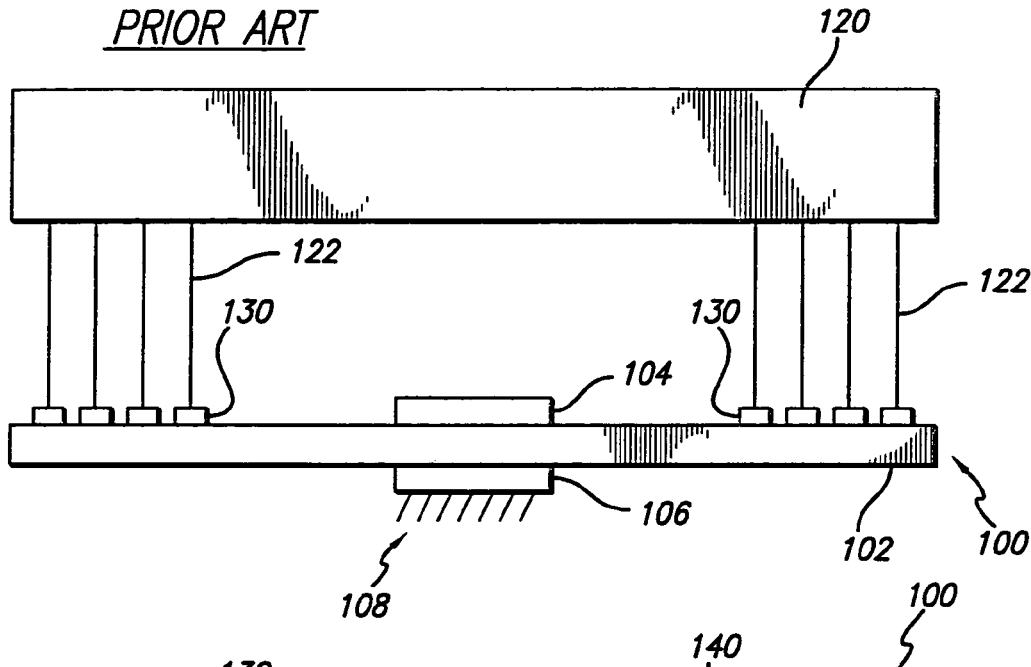
FIG. 1A illustrates a typical probe card assembly and connections to a semiconductor tester.
Figure 1B:
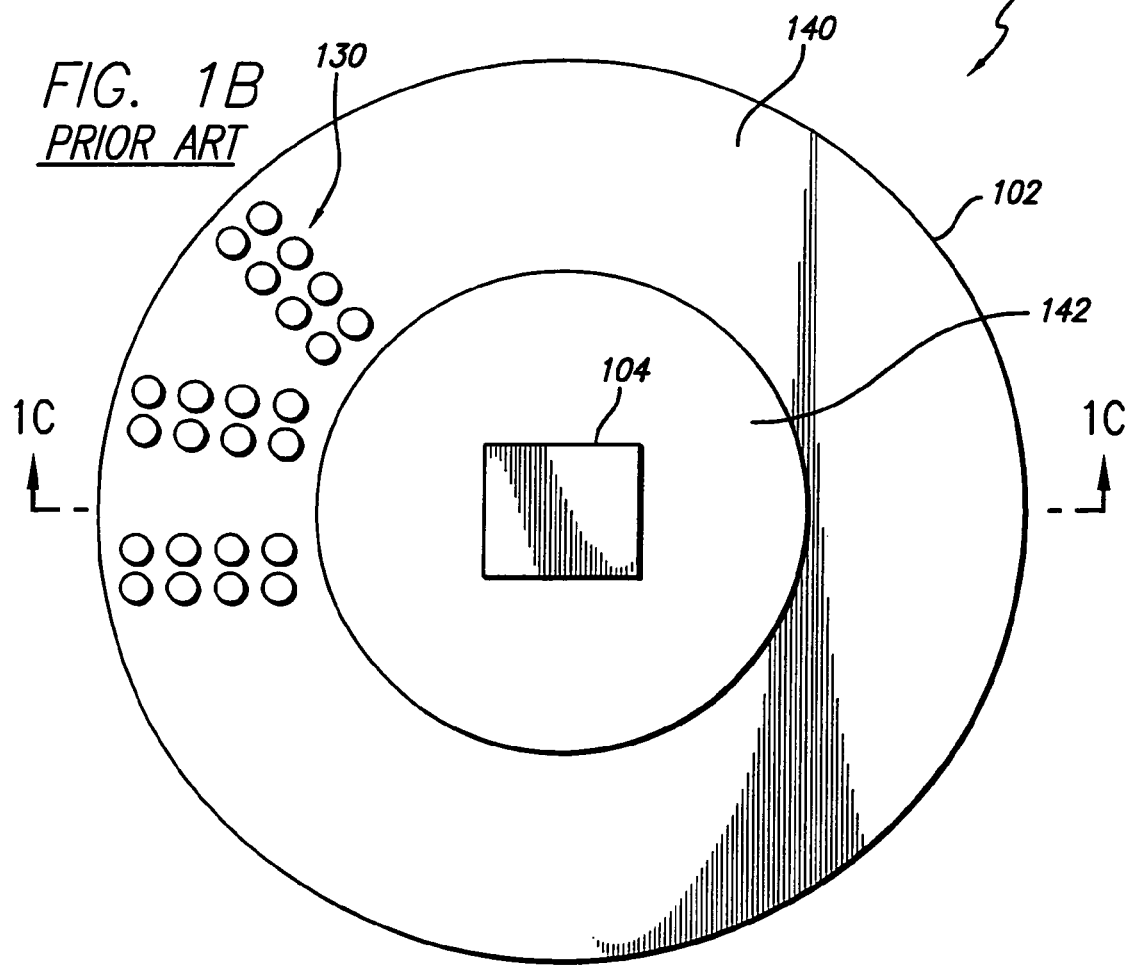
FIG. 1B is a top view of the probe card assembly shown in FIG. 1A.
Figure 1C:
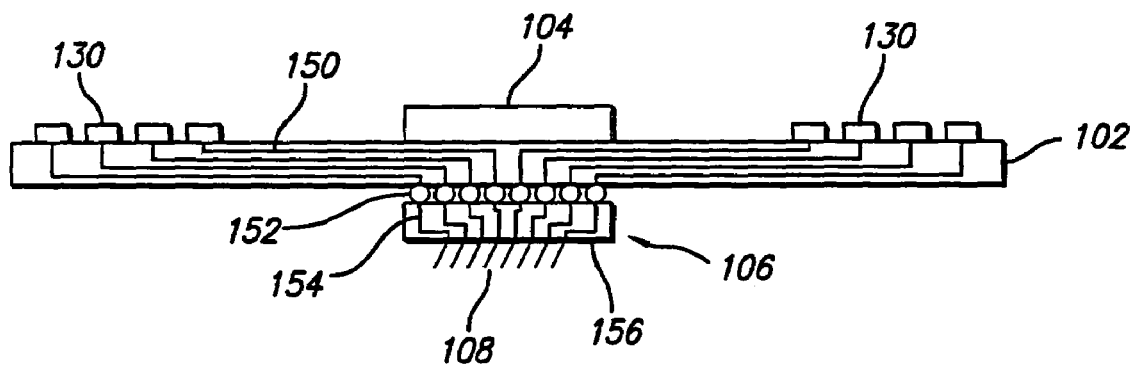
FIG. 1C is a sectional view of the probe card assembly of FIG. 1B.
Figure 2:
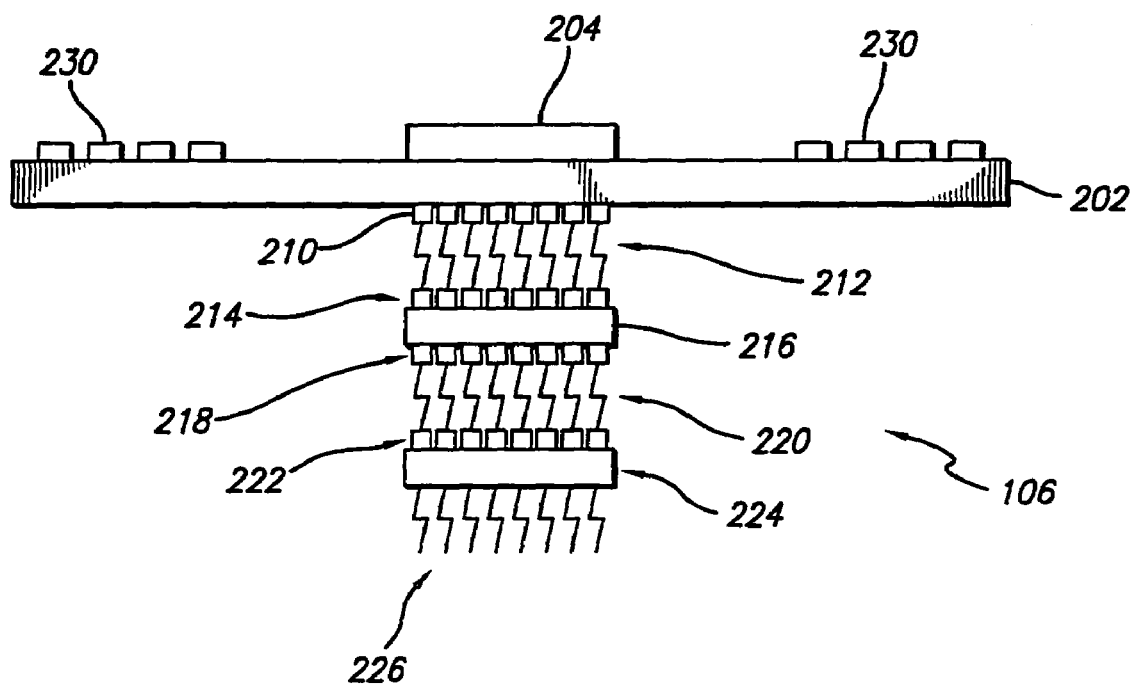
FIG. 2 is a side view of a probe card assembly with a probe head assembly comprised of an interposer and a space transformer.
Figure 3A:
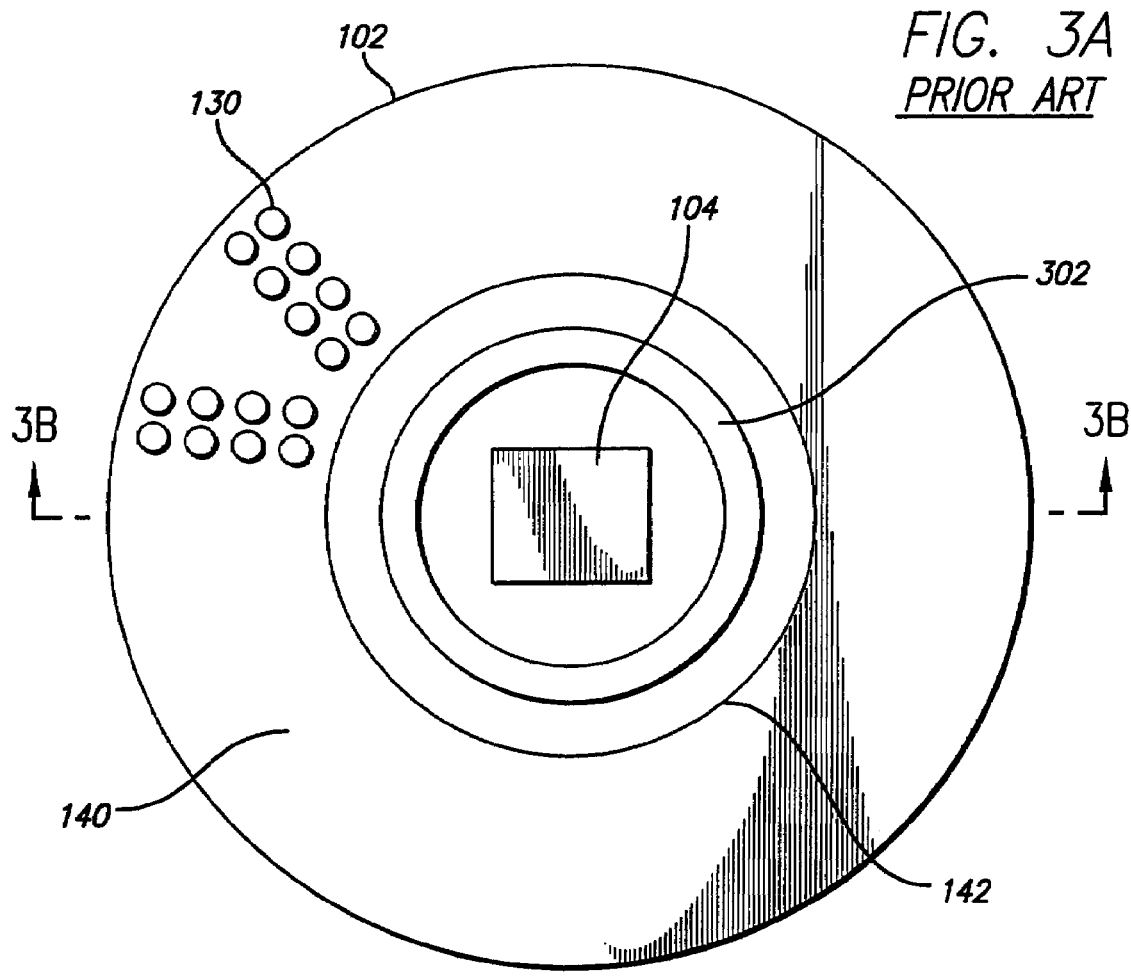
FIG. 3A is a top view of a typical probe card assembly with processing circuitry.
Figure 3B:
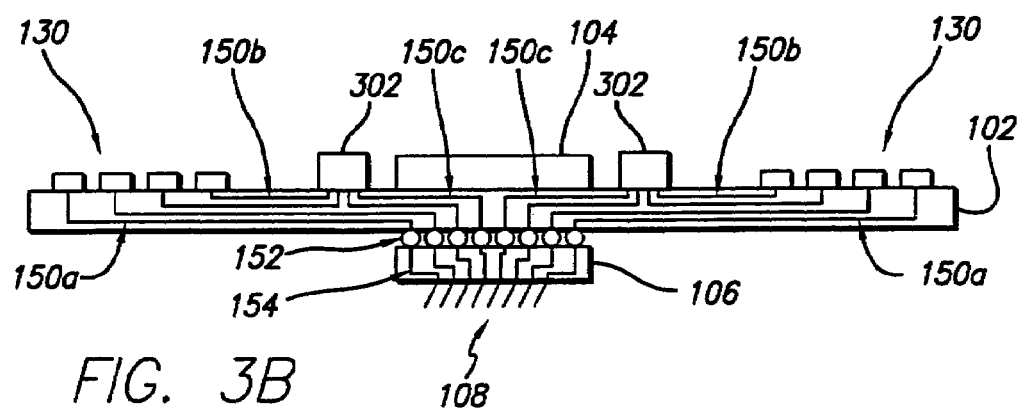
FIG. 3B is a sectional view of the probe card assembly of FIG. 3A.

FIGS. 4A–4E illustrate a first exemplary embodiment of the invention. As shown, a probe head assembly 406 is attached to a printed circuit board 402 via mechanism 416. The probe head assembly 406 includes probes 408 for contacting a semiconductor device (not shown) under test. The probe head assembly 406 may be of any design, including without limitation the probe head assembly illustrated in FIGS. 1A–1C or the probe head assembly illustrated in FIG. 2. Indeed, the particular design of the probe head assembly 406 is not critical to the invention.

In the exemplary embodiment illustrated in FIGS. 4A–4E, screws or bolts 422 fasten the probe head assembly 406 to the mechanism 416 via through holes 410, 412, 420 in the probe head assembly, printed circuit board 402, and mechanism. The means for fastening the probe head assembly 406 to the mechanism 416, however, is not critical to the invention and any suitable means that securely fastens the probe head assembly 406 to the mechanism 416 may be used.

Figure 4A:
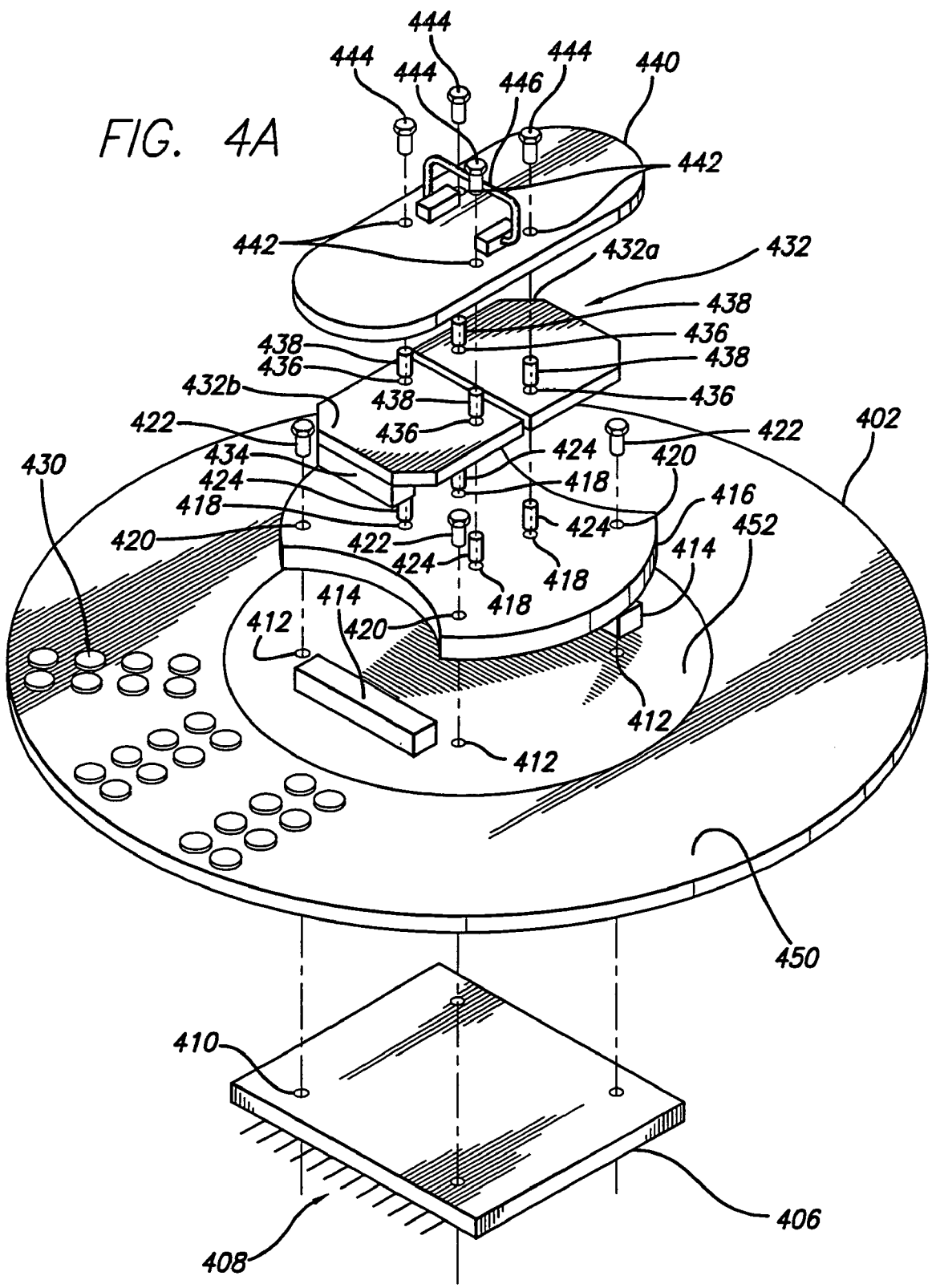
FIG. 4A illustrates an exploded view of a first exemplary embodiment of the invention.
Figure 4D:
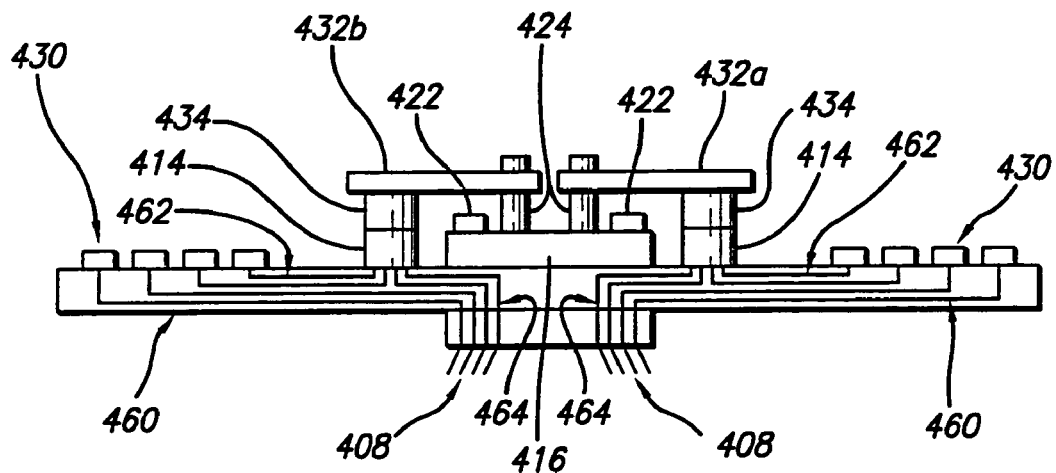
FIG. 4D illustrates a sectional view of FIG. 4C.

The printed circuit board 402 includes an outer area 450 containing contacts 430 for connecting to a semiconductor tester (not shown). The printed circuit board 402 also includes an inner area 452. The probe head assembly 406 and the mechanism 416 are located within the inner area 452. The inner area 452 also includes two electrical connectors 414 designed to mate with corresponding electrical connectors 434 on daughter card 432. As illustrated in FIG. 4D, one or more traces 460 in printed circuit board 402 may connect one or more tester contacts 430 directly to probe head assembly 406. One or more traces 462, however, may connect other tester contacts 430 with processing circuitry (not shown) located on daughter card 432 via connector pairs 414, 434. Other traces 464 connect processing circuitry (not shown) on daughter card 432 via connector pairs 414, 434 to probe head assembly 406. Although two connector pairs 414, 434 are illustrated in the exemplary embodiment of FIGS. 4A–4E, any number of connector pairs 414, 434 may be used with the present invention. It should be noted that portions of the processing circuitry (not shown) may be located other than on the daughter card (432). For example, portions of the processing circuitry may be located on the printed circuit board 402 in the inner area 452 or anywhere else that the circuitry would not interfere with connections to the semiconductor tester (not shown).

The mechanism 416 is preferably made of a relatively hard, durable material. Suitable materials include but are not limited to metals such as steel, titanium, aluminum, or the like. Composite materials such as organic polymers are another example of the types of materials that can be used to make mechanism 416. It should be apparent that the composition of the mechanism 416 is not critical to the invention, and any material may be used to fabricate the mechanism as long as the mechanism is capable of securely fastening the probe head assembly 406 to the printed circuit board 402. As shown in FIG. 4B (which illustrates a top view of the probe card assembly of FIG. 4A without the cover 440 and the daughter card 432), the mechanism 416 may be generally circular in shape to generally match the pattern of the inner area 452 of the printed circuit board 402. As also shown in FIG. 4B, the mechanism 416 may be shaped to include recesses for connector pairs 414, 434. Nevertheless, such recesses are not necessary to the present invention, nor is any particular shape of the mechanism 416 necessary to the invention.

Mounted on top of the mechanism 416 and substantially co-planar (e.g., within fifteen degrees of perfect coplanality) with the printed circuit board 402 is daughter card 432. Daughter card 432 contains circuitry (not shown) for processing signals passing between the semiconductor tester (not shown) and the semiconductor device under test (not shown). Such circuitry may enhance the testing capabilities of the semiconductor tester. For example, the circuitry may customize the test signals output by the semiconductor tester (not shown) to the specific testing needs of the semiconductor device under test (not shown). Examples of such circuits are discussed below with respect to FIGS. 7 and 8.

Daughter card 432 is preferably made of printed circuit board material. Daughter card 432, however, may be any type of planar object on which electrical circuit elements (not shown) can be mounted and connected to one another. As illustrated in FIGS. 4A and 4C–4E, daughter card 432 preferably consists of two distinct cards 432a and 432b. Nevertheless, daughter card 432 may consist of a single card or a collection of more than two cards. Circuit elements (not shown) may be located on either side of daughter card 432 or on both sides.

Daughter card 432 may be fastened to mechanism 416 via screws or bolts 444 that pass through holes 436 in the daughter card, and holes 418 in mechanism 416. Again, however, the means for fastening the daughter card 432 to the mechanism 416 is not critical to the invention and any suitable means by which the daughter card 432 is securely fastened to the mechanism 416 may be used. Spacers 424 may optionally be used to ensure a minimum distance between daughter card 432 and mechanism 416.

Figure 4E:
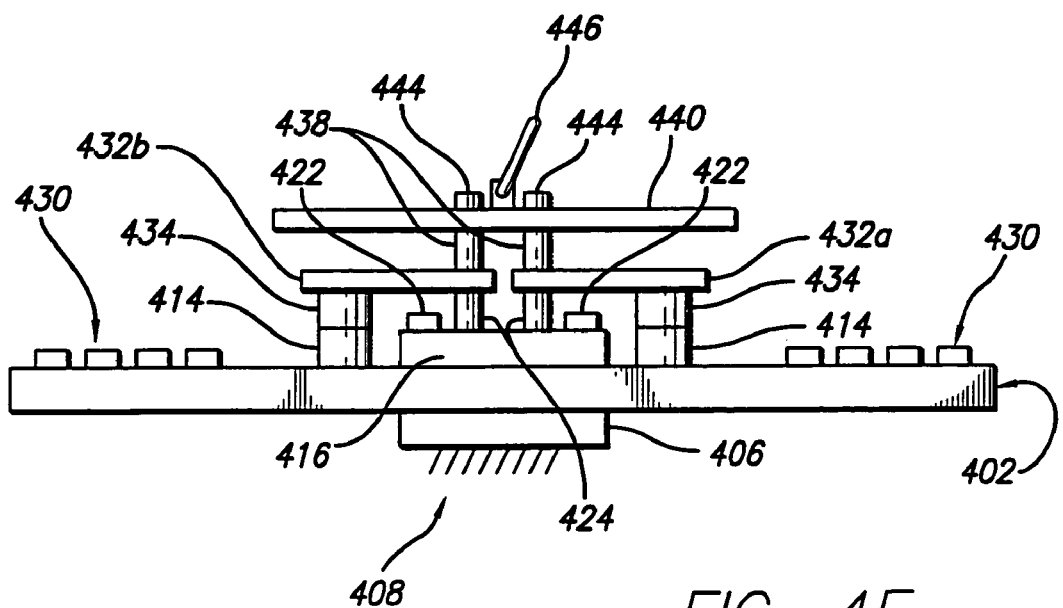
FIG. 4E illustrates a side view of the embodiment of FIG. 4A.

Although not critical to the invention, an optional cover 440 may be included for protecting the daughter card 432 and any circuit elements or traces (not shown) that may be located on the top surface of the daughter card. As illustrated in FIGS. 4A and 4E, the cover 440 may be fastened to the daughter card 432 using screws or bolts 444 and through holes 442 in the cover. In addition, spacers 438 may be used to ensure sufficient room between the cover 440 and the daughter card 432 for any circuit elements or traces (not shown) located on the top surface of the daughter card. The cover 440 may also include a handle 446 for carrying the probe card assembly.

Figure 5A:
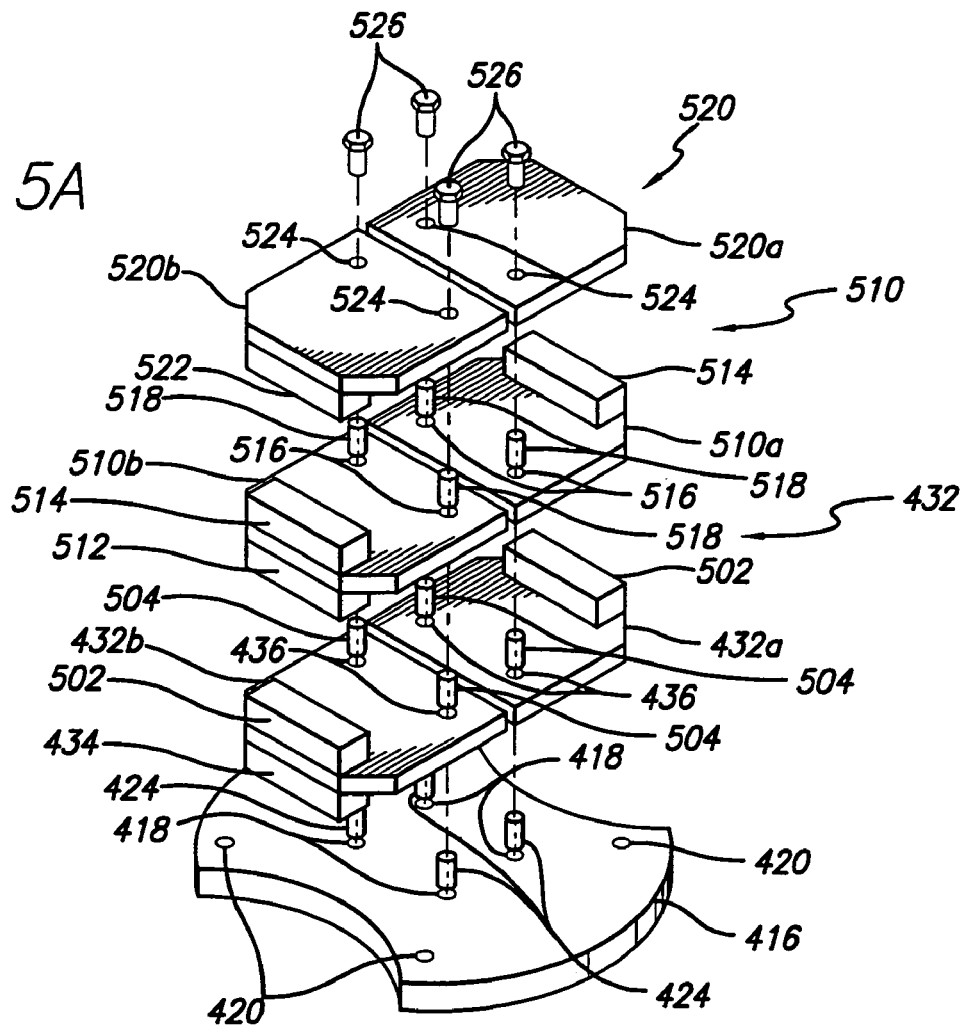
FIG. 5A illustrates an exploded view of an exemplary alternative mechanism and daughter card arrangement.
Figure 5B:
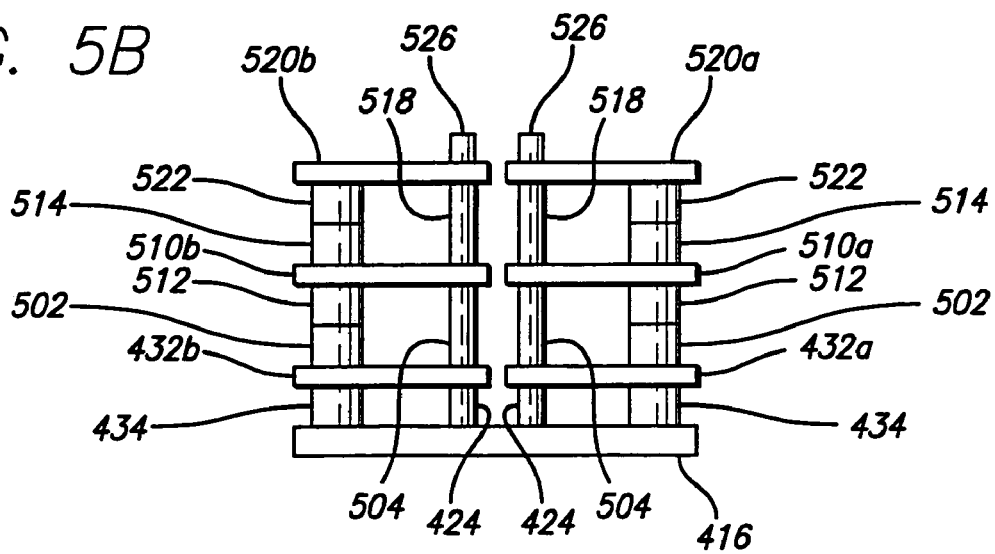
FIG. 5B illustrates a side view of FIG. 5A.

FIGS. 5A and 5B illustrate a modification to the embodiment illustrated in FIGS. 4A–4E. In FIGS. 5A and 5B, two additional daughter cards 510 and 520 are stacked on top of daughter card 432. As shown in FIGS. 5A and 5B, the additional daughter cards 510, 520 each preferably consist of two halves. That is, daughter card 510 consists of card 510a and card 510b, and daughter card 520 likewise consists of card 520a and card 520b. As with daughter card 432, however, daughter cards 510, 520 may consist of a single, unitary card or may consist of more than two cards.

As shown in FIGS. 5A and 5B, the three daughter cards 432, 510, 520 are preferably stacked one on top of the other. Like daughter card 432, each daughter card 510, 520 is substantially coplanar with printed circuit board 402. As shown in FIGS. 4A–4E, daughter card 432 includes downward facing electrical connectors 434 for connecting to electrical connectors 414 on the printed circuit board 402. In the configuration of FIG. 5A and 5B, daughter card 432 also includes upward facing electrical connectors 502 for connecting to downward facing electrical connectors 512 on daughter card 510. Daughter card 510 similarly has upward facing electrical connectors 514 for connecting to electrical connectors 522 on daughter card 520.

The stacked daughter cards 432, 510, 520 may be fastened to each other and to the mechanism 416 by screws or bolts 526 that pass through holes 524, 516, 436 in the daughter cards and holes 418 in the mechanism 416. Nevertheless, the means for fastening the stacked daughter cards 432, 510, 520 to each other and the mechanism 416 is not critical to the invention and any suitable means may be used that securely fastens the daughter cards to each other and the mechanism. Although not critical to the invention, spacers 424, 504, 518 may be used to separate the daughter cards 432, 510, 520 one from another.

Although FIGS. 5A and 5B illustrate three daughter cards 432, 510, 520, any number of daughter cards may be stacked one on top of the other. For example, two daughter cards 432, 510 may be stacked one on top of the other. Alternatively, more than three daughter cards may be stacked one on top of the other.

FIGS. 6A–6E illustrate yet another exemplary embodiment of the invention. Like the embodiment of FIGS. 4A–4E, the embodiment illustrated in FIGS. 6A–6E includes a probe head assembly 606 that is securely fastened to a printed circuit board 602 via mechanism 616. The printed circuit board includes tester contacts 630 for connecting to a semiconductor tester (not shown) and routing signals between the semiconductor tester and probes 608 on the probe assembly 606. The embodiment illustrated in FIGS. 6A–6E also includes a daughter card 632 on which may be located circuitry (not shown) for processing signals passing between the tester contacts 630 and the probes 608.

Figure 6A:
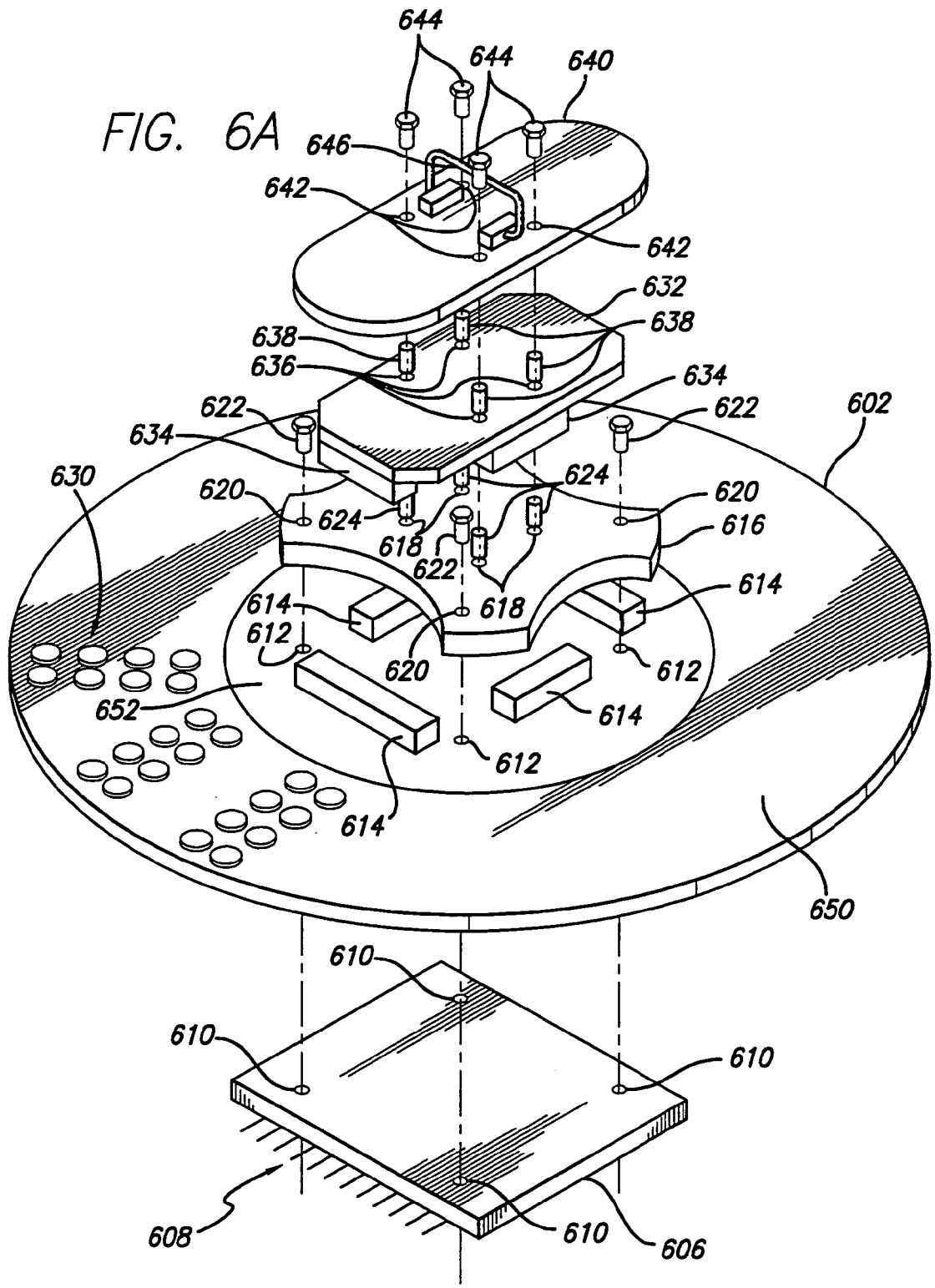
FIG. 6A illustrates an exploded view of a second exemplary embodiment of the invention.
Figure 6B:
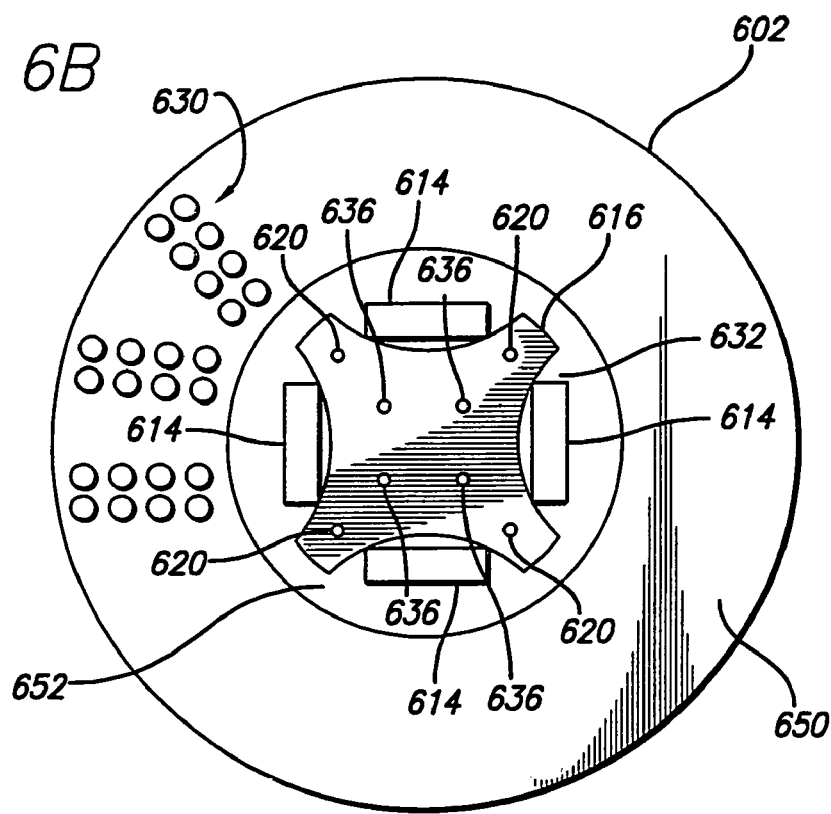
FIG. 6B illustrates a top view of the embodiment of FIG. 6A without its cover and daughter card.
Figure 6C:
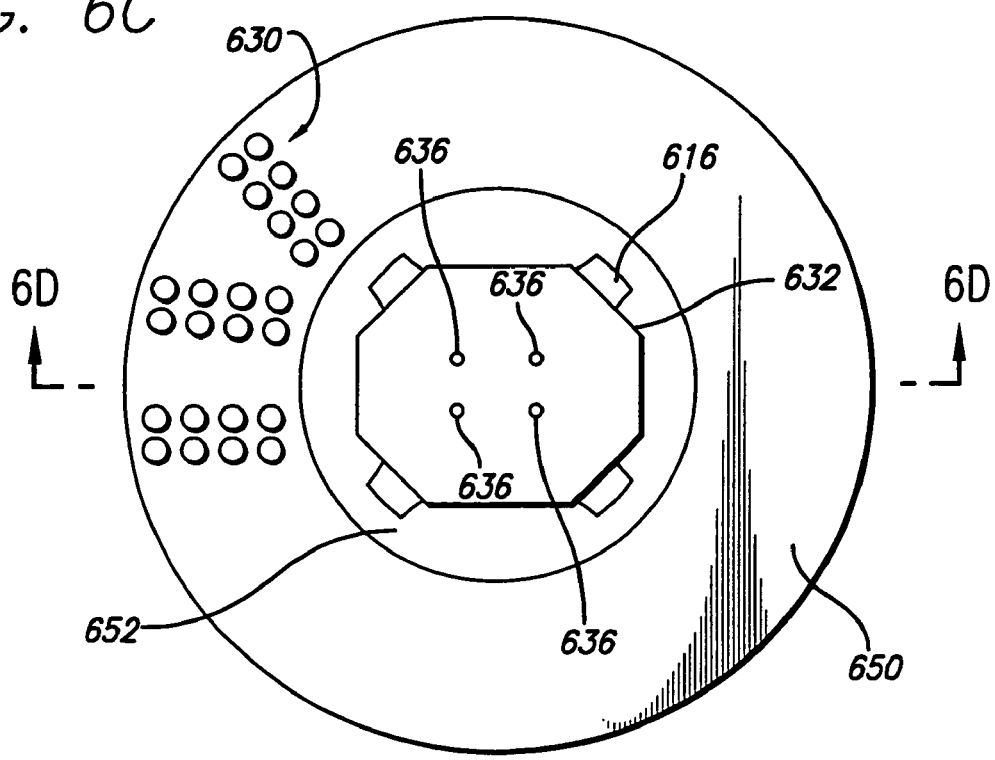
FIG. 6C illustrates a top view of the embodiment of FIG. 6A without its cover.

In the embodiment illustrated in FIGS. 6A–6E, four pairs of electrical connectors 614, 634 connect one or more of the tester contacts 630 with the processing circuit (not shown) on daughter card 632. Similarly, connector pairs 614, 634 connect one or more probes 608 with the processing circuitry (not shown) on daughter card 632. As illustrated in FIG. 6D, one or more traces 660 in printed circuit board 602 may connect one or more tester contacts 630 directly to probe head assembly 606. One or more traces 662, however, may connect one or more tester contacts 630 with processing circuitry (not shown) located on daughter card 632 via connector pairs 614, 634. Similarly, one or more traces 664 may connect processing circuitry (not shown) on daughter card 632 via connector pairs 614, 634 to the probe head assembly 606. Like the embodiment of FIGS. 4A–4E, the embodiment of FIGS. 6A–6E may include a protective cover 640 and a carrying handle 646. As with the embodiment illustrated in FIGS. 4A–4E, portions of the processing circuit (not shown) may be located off of the daughter card 632, such as on the printed circuit board 602 within the inner area 652 or any where else that the circuit elements do not interfere with connections to the semiconductor tester.

Although not depicted in drawings, multiple daughter cards of the type illustrated in FIGS. 6A–6E may be stacked one on top of the other as illustrated in FIGS. 5A and 5B. Thus, an embodiment similar to that illustrated in FIGS. 5A and 5B may be created using the daughter card type illustrated in FIGS. 6A–6E.

Figure 7:
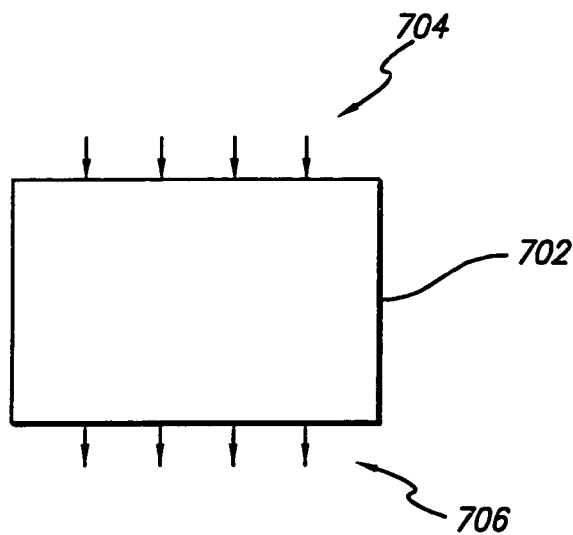
FIG. 7 illustrates a box diagram of an exemplary processing circuit.

FIG. 7 illustrates a block diagram of a processing circuit 702 that may be located partially or entirely on one or more daughter cards such as those illustrated in FIGS. 4A–4E and 6A–6E. As shown, one or more signals are input 704 into processing circuit 702. The processing circuit processes the input signals and outputs processed signals 706. The input signals 704 may be test signals generated by semiconductor tester (not shown), in which case such test signals would be processed by processing circuit 702, and output signals 706 would be routed to probes on the probe head assembly. Alternatively, input signals 704 may be response signals generated by the semiconductor device in response to test signals input into the semiconductor device. In such a case, the response signals are processed by processing circuit 702, and output signals 706 would be routed back to the semiconductor tester. As yet another alternative, input signals 704 may be a combination of test signals from the semiconductor tester and response signals generated by the semiconductor device. Thus, the processing circuit 702 located at least in part on one or more daughter cards may process test signals generated by the semiconductor tester before passing the test signals to the semiconductor device, and/or the processing circuit may process response signals generated by the semiconductor device. Of course, the processing circuit 702 may itself consist of multiple circuits or subcircuits.

Generally speaking, the processing circuit 702 is configured to enhance the test capabilities of the semiconductor tester. For example, as discussed above, the test needs of any given semiconductor device are unique. Semiconductor testers, however, are typically capable of generating only a fixed number of different types or patterns of test data. Because these fixed types or patterns of test data do not always meet the test needs of any given semiconductor device, it may be necessary to process the test signals generated by the semiconductor tester in order to customize the test signals to the particular needs of the semiconductor device. In other instances, it may be desirable, although not strictly necessary, to customize the test data. For example, it may be possible to optimize the tests performed on the semiconductor device by including a processing circuit 702 to customize test data. Alternatively or in addition, it may be necessary or desirable to process the response signals generated by the semiconductor device in response to the test signals.

The physical structure of the processing circuit 702 consists of circuit elements arranged and connected to form a circuit that enhances the test capabilities of the semiconductor tester as described above. (As used herein, test data includes but is not limited to one or both of the following: test signals generated by a semiconductor apparatus, and/or response signals generated by the semiconductor in response to such test signals.) The circuit elements may include digital logic circuit elements, microprocessors or microcontrollers, digital memories, analog circuit elements, digital-to-analog converters, analog-to-digital converters, or any combination of the foregoing. Moreover, such circuit elements may include discrete circuit elements, integrated circuit elements, or both.

There are many different ways in which the test data generated by the semiconductor tester and/or the response data generated by the semiconductor device under test could be processed to enhance the test capabilities of the semiconductor tester. The following is a nonexclusive, nonexhaustive list of examples. The processing circuit 702 could be configured to change the timing of some or all of the test data or response data. The processing circuit 702 could be configured to change the frequency of some or all of the test data or response data. The processing circuit 702 could be configured to act as a semiconductor tester itself, by generating test data patterns or retrieving stored test data patterns in response to commands received from the semiconductor tester. The processing circuit 702 could be configured to route response signals to destinations other than the semiconductor tester. The processing circuit 702 could be configured to analyze the response data and could be further configured to take specific actions based on its analysis of the response data. The processing circuit 702 could be configured to change analog signals to digital signals or digital signals to analog signals.

The design of specific circuits for performing one or more of the foregoing processing functions is within the skill of those practicing in the field. As discussed above, specific circuit designs would include any combination of the following circuit elements configured to perform one or more of the foregoing processing functions: digital logic circuit elements, microprocessors or microcontrollers, digital memories, analog circuit elements, digital-to-analog converters, analog-to-digital converters, or similar circuit elements.

One nonexclusive specific example of such a circuit is as follows. An exemplary circuit 702 could be configured to compensate for a mismatch between the amount of test data generated by the semiconductor tester (not shown) and the number of probes 408, 608 on the probe head assembly 406, 606 configured to provide input of test data into the semiconductor device (not shown). Similarly, the processing circuit 702 could be configured to compensate for a mismatch between the number probes 408, 608 sensing response signals generated by the semiconductor device and the number of such response signals the semiconductor tester (not shown) is capable of processing.

Figure 8:
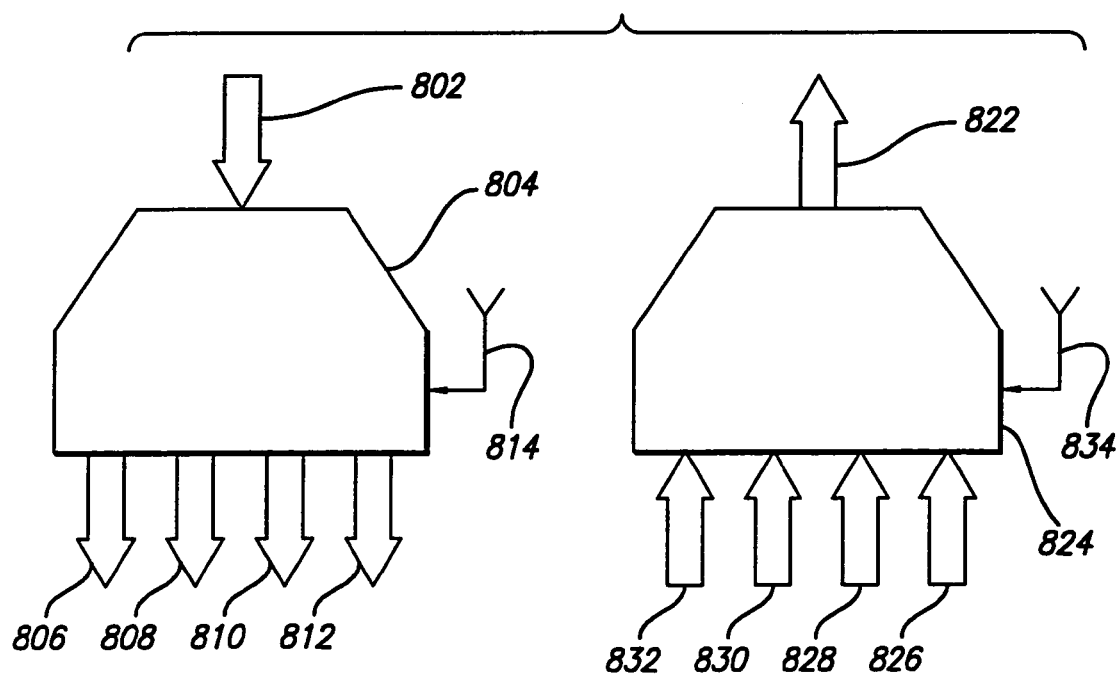
FIG. 8 illustrates an exemplary processing circuit.

FIG. 8 illustrates an exemplary configuration of the processing circuit 702 that utilizes multiplexers to compensate for both types of mismatches. That is, a semiconductor tester (not shown) generates fewer test signals than there are probes 408, 608 for inputting test data into the semiconductor device under test (not shown), and there are more probes 408, 608 monitoring responses generated by the semiconductor device than the semiconductor tester can process at once.

The exemplary processing circuit shown in FIG. 8 is designed for use with a semiconductor tester that generates 500 test signals and expects 250 response signals from the semiconductor device. The probe card assembly, however, has 2000 probes for inputting test signals into the semiconductor device and 1000 probes for sensing responses generated by the semiconductor device. The circuit receives on an input bus 802 to multiplexer 804 500 test signals generated by the semiconductor tester. Output buses 806, 808, 810, 812 are each connected to a different set of 500 of the 2000 probes for delivering test signals to the semiconductor device. Selector 814 selects which of output buses 806, 808, 810, 812 input bus 802 is connected to. Thus, by controlling selector 814, the 500 test signals on input bus 802 can be delivered to a selected one of a set of 500 probes. Similarly, multiplexer 824 has four input buses 826, 828, 830, 832 each connected to a different set of 250 probes that are monitoring signals generated by the semiconductor device under test in response to a set of 500 test signals. Selector 834 selects which of the input buses 826, 828, 830, 832 is connected to output bus 822. Multiplexer 824 thus controls which of a set of 250 signals generated by the semiconductor device under test in response to test signals will be feed back to the semiconductor tester.

In practice, selector 814 is set to deliver a first set of 500 test signals generated by the semiconductor tester to a first set of 500 probes contacting the semiconductor device under test. At the same time, selector 834 is set to route a corresponding first set of 250 responses generated by the semiconductor device back to the semiconductor tester. The selector 814 is then set to deliver a second set of 500 test signals generated by the semiconductor tester to a second set of 500 probes contacting the semiconductor device under test. Selector 834 is likewise set to route a corresponding second set of 250 responses generated by the semiconductor device back to the semiconductor tester. This process continues with a third set and then a fourth set of test signals being delivered to a third set of probes and then a fourth set of probes. At the same time, a third set of responses and then a fourth set of responses are routed back to the semiconductor tester. In this manner four sequentially generated sets of 500 test signals are sequentially routed to four sets of 500 input test points on the semiconductor device, and four sets of 250 response signals, each generated in response to one of the sets of test signals are routed back to the semiconductor tester.

It should be stressed that the circuit illustrated in FIG. 8 is exemplary only. As discussed above, the circuit 702 represents any processing circuit comprising circuit elements arranged and connected to enhance the test capabilities of the semiconductor tester by, for example, customizing test data flowing between a semiconductor tester and a semiconductor device.

Having thus described exemplary embodiments of the invention, it should be apparent that various modifications, adaptations, and alternative embodiments may be made within the scope and spirit of the invention. The invention is intended to be limited only by the following claims.

What is claimed is:

1. A method of testing a semiconductor device, said method comprising:
   receiving at a substrate test signals from a semiconductor tester apparatus;
   enhancing said test signals using an electric circuit that is disposed at least in part on a daughter card attached to a first side of said substrate; and
   outputting said enhanced test signals to said semiconductor device through probes that are disposed to a second side of said substrate, wherein said second side of said substrate is opposite said first side.

2. The method of claim 1, wherein said electric circuit comprises at least one of a digital logic element, a microprocessor, an analog circuit element, a digital-to-analog converter, or an analog-to-digital converter.

3. The method of claim 1, wherein said electric circuit enhances said test data by customizing at least a portion of said test data to test needs of said semiconductor device under test.

4. The method of claim 3, wherein said test signals are generated by said semiconductor test apparatus and said electric circuit customizes at least a portion of said test signals.

5. The method of claim 3, wherein said electric circuit customizes at least a portion of response signals generated by said semiconductor device.

6. The method of claim 1 further comprising a plurality of said daughter cards.

7. The method of claim 6, wherein said plurality of daughter cards are disposed in stacked relationship to each other.

8. The method of claim 6, wherein at least a portion of said electric circuit is disposed on each of said plurality of daughter cards.

9. The method of claim 8, wherein said electric circuit comprises at least one of a digital logic element, a microprocessor, an analog circuit element, a digital-to-analog converter, or an analog-to-digital converter.

10. The method of claim 8, wherein said electric circuit enhances said test signals by customizing at least a portion of said test signals to test needs of said semiconductor device under test.

11. The method of claim 10, wherein said test signals are generated by said semiconductor test apparatus.

12. The method of claim 10, wherein said electric circuit customizes at least a portion of response signals generated by said semiconductor device.

13. The method of claim 6, wherein said plurality of daughter cards includes at least three daughter cards.

14. The method of claim 13, wherein at least a portion of said electric circuit is disposed on each of said at least three daughter cards.

15. The method of claim 13, wherein said at least three daughter cards are disposed in stacked relationship to each other.

16. A method for electrically communicating test data between a semiconductor test apparatus and a semiconductor device under test, said method comprising:
   configuring a printed circuit board to make electrical connections with said semiconductor tester apparatus,
   configuring a plurality of probes to make electrical connections with said semiconductor device,
   providing a daughter card on said printed circuit board, and
   configuring an electric circuit to receive as input test data received at said probe card assembly from one of said tester apparatus or said semiconductor device under test, enhance said test data, and output enhanced test data, at least a portion of said electric circuit being disposed on said daughter card.

17. The method of claim 16 further comprising providing a plurality of said daughter cards.

18. The method of claim 17, wherein said daughter cards are disposed in stacked relationship to each other.

19. The method of claim 17, wherein said plurality of daughter cards includes at least two daughter cards.

20. The method of claim 17, wherein said plurality of daughter cards includes at least three daughter cards.

21. The method of claim 16, wherein said test data comprises test signals generated by said semiconductor tester apparatus and said electric circuit processes at least a portion of said test signals.

22. The method of claim 16, wherein said test data comprises response signals generated by said semiconductor device and said electric circuit processes at least a portion of said response signals.

23. The method of claim 16, wherein said plurality of probes are configured to contact a plurality of semiconductor devices under test, and said electric circuit enhances said test data by receiving test signals from said semiconductor tester apparatus for testing a first number of semiconductor devices and outputting to said probes test signals for testing a second number of semiconductor devices, wherein said second number is greater than said first number.

24. The method of claim 16, wherein said daughter card is secured substantially coplanar to said printed circuit board and there is a space between said daughter card and said printed circuit board.

25. The method of claim 16, wherein said probe card assembly comprises said printed circuit board and said probes.

26. The method of claim 1, wherein said daughter card is secured substantially coplanar to said substrate and there is a space between said daughter card and said substrate.

* * * * *